(12) United States Patent
Tang et al.

(10) Patent No.: US 9,741,566 B2
(45) Date of Patent: Aug. 22, 2017

(54) METHODS FOR MANUFACTURING A SPACER WITH DESIRED PROFILE IN AN ADVANCED PATTERNING PROCESS

(71) Applicant: Applied Materials, Inc., Santa Clara, CA (US)

(72) Inventors: Dai-Wen Tang, Taipei (TW); Hui Sun, Santa Clara, CA (US); Chung Liu, Foster City, CA (US); Benjamin Schwarz, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/043,183

(22) Filed: Feb. 12, 2016

(65) Prior Publication Data

US 2016/0293420 A1 Oct. 6, 2016

Related U.S. Application Data

(60) Provisional application No. 62/140,365, filed on Mar. 30, 2015.

(51) Int. Cl.
| | |
|---|---|
| *H01L 21/033* | (2006.01) |
| *H01L 21/308* | (2006.01) |
| *H01L 21/311* | (2006.01) |
| *H01L 21/3213* | (2006.01) |

(52) U.S. Cl.
CPC ...... *H01L 21/0337* (2013.01); *H01L 21/0338* (2013.01); *H01L 21/3086* (2013.01); *H01L 21/3088* (2013.01); *H01L 21/31122* (2013.01); *H01L 21/32137* (2013.01); *Y10S 438/947* (2013.01)

(58) Field of Classification Search
None
See application file for complete search history.

(56) References Cited

U.S. PATENT DOCUMENTS

| | | | |
|---|---|---|---|
| 9,177,820 B2 | 11/2015 | Bergendahl et al. | |
| 2006/0046200 A1* | 3/2006 | Abatchev | H01L 21/0337 430/313 |
| 2007/0077524 A1 | 4/2007 | Koh et al. | |
| 2014/0010853 A1 | 1/2014 | Williams et al. | |
| 2014/0302684 A1* | 10/2014 | Sekine | H01L 21/31116 438/723 |
| 2015/0151329 A1 | 6/2015 | Kawanishi et al. | |
| 2015/0155176 A1 | 6/2015 | Mignot et al. | |

\* cited by examiner

*Primary Examiner* — Jiong-Ping Lu
(74) *Attorney, Agent, or Firm* — Patterson + Sheridan LLP

(57) ABSTRACT

Embodiments herein provide apparatus and methods for performing an etching process on a spacer layer with good profile control in multiple patterning processes. In one embodiment, a method for patterning a spacer layer during a multiple patterning process includes conformally forming a spacer layer on an outer surface of a patterned structure disposed on a substrate, wherein the patterned structure has having a first group of openings defined therebetween and etching the spacer layer disposed on the substrate while forming an oxidation layer on the spacer layer.

18 Claims, 5 Drawing Sheets

METHODS FOR MANUFACTURING A SPACER WITH DESIRED PROFILE IN AN ADVANCED PATTERNING PROCESS

CROSS-REFERENCE TO RELATED APPLICATIONS

This application claims benefit of U.S. Provisional Application Ser. No. 62/140,365 filed Mar. 30, 2015, which is incorporated by reference in their entirety.

BACKGROUND OF THE DISCLOSURE

Field

The embodiments herein generally relate to a fabrication process for forming a flowable dielectric layer for use in a lithographic multi-patterning fabrication process.

Description of the Background Art

Reliably producing submicron and smaller features is one of the key requirements of very large scale integration (VLSI) and ultra large scale integration (ULSI) of semiconductor devices. However, with the continued miniaturization of circuit technology, the dimensions of the size and pitch of circuit features, such as interconnects, have placed additional demands on processing capabilities. The multilevel interconnects that lie at the heart of this technology require precise imaging and placement of high aspect ratio features, such as vias and other interconnects. Reliable formation of these interconnects is critical to further increases in device and interconnect density. Additionally, forming sub-micron size features and interconnects with reduced waste of intermediate materials, such as resists and hardmask materials, is desired.

As circuit densities increase for next generation devices, the width or pitch of interconnects, such as vias, trenches, contacts, devices, gates and other features, as well as the dielectric materials there between, are decreasing to 45 nm and 32 nm dimensions and beyond. As device scaling was extended to further below the resolution limit of the lithography scanners, multi-patterning was employed to enable meeting the feature density requirements of today's integrated devices. Multi-patterning is a process of performing several resist coating, lithographic patterning, and etching operations to ultimately pattern a film layer in multiple steps. When combined, the overlapping pattern operations form the features in an underlying hardmask layer, which when fully patterned, may be used to pattern an underlying layer, or serve as an implant or diffusion mask.

In one example, multiple patterning processes are widely employed in forming small features in a hardmask layer. Self-aligned double patterning (SADP) is a double patterning process used for extending the capabilities of photolithographic techniques beyond the minimum pitch. FIG. 1 depicts an example of a conventional prior art cycle 100 for a self-aligned double patterning (SADP) or self-aligned triple patterning (SATP) or even self-aligned quadruple patterning (SAQP) used to etch a hardmask layer. The conventional cycle 100 is depicted in snapshots from FIG. 1A-FIG. 1D, which are depictions of the same portions of the substrate as processing thereof progresses. In the example, a low-K layer 103 is disposed on a substrate 101. A hardmask layer 105 may be disposed on the low-K layer 102 with a patterned structure 108 (e.g., a structure patterned formed by a dielectric layer, a photoresist layer or any suitable materials for patterning) formed thereover, defining openings 118 therein. It is noted that between the patterned structure 108 and the hardmask layer 105, additional sacrificial layers may be formed to assist patterning the underlying layers. In FIG. 1B, a spacer layer 126 may be formed conformally on sidewalls 111 and a top surface 109 of the patterning structure 108 to further reduce dimensions of the opening 118 (in FIG. 1) to openings 125. In FIG. 1C, an etching process is performed to etch a portion of the spacer layer 126 from the substrate 101 until the top surface 109 of the patterned structure 108 is exposed and a surface of the underlying hardmask layer 105 is exposed. In FIG. 1D, a final etching process is performed to remove the patterned structure 108 from the substrate 101, leaving the spacer layer 126 defining new openings 145 with reduced dimensions in the spacer layer 116 on the substrate 101. After the hardmask layer 105 is further patterned using the patterned spacer layer 126 as an etching mask, a self-aligned double patterning (SADP) is then considered completed. In some cases, the process may be continued to form an additional spacer layer to further narrow down the dimension of the openings 145 to even narrower openings as needed. It is noted that numbers of the spacer layers may be formed as many as desired as long as the openings defined in between does not close-up and spacer layers apart defined by the openings.

During etching of the spacer layer 126 in FIG. 1C, different etching rates for different materials (e.g., patterned structures 108, the spacer layer 126 and the underlying hardmask layer 105) on the substrate 101 may result in different etching dimensions or asymmetric etching profile formed at different places of the resultant structure. In particular, after the etching process, the corners 132 of the spacer layer 126, as indicated in the circle 130, often suffer from rounded top shoulder erosion or undesired non-vertical sidewall etched profile, resulting in critical dimension (CD) loss or deformed profiles. Inaccurate critical dimension or profile deformation of the patterned structure may cause a light beam out-of focus issues, overlay errors and a significant resolution loss during the subsequent lithography exposure process. In some cases, inaccurate profile or structural dimensions may result in collapse of the device structure, eventually leading to device failure and product low yield.

Therefore, there is a need for an improved method for accurate profile control during a multi-patterned process.

SUMMARY

Embodiments herein provide apparatus and methods for performing an etching process on a spacer layer with good profile control in multiple patterning processes to form nanowires for semiconductor applications. In one embodiment, a method for patterning a spacer layer during a multiple patterning process includes conformally forming a spacer layer on an outer surface of a patterned structure disposed on a substrate, wherein the patterned structure has having a first group of openings defined therebetween and etching the spacer layer disposed on the substrate while forming an oxidation layer on the spacer layer.

In another embodiment, a method for patterning a spacer layer during a multiple patterning process includes performing a patterning process on a spacer layer disposed on a substrate, wherein the spacer layer is conformally formed on an outer surface of a patterned structure formed on a film stack disposed on a substrate, wherein the patterning process further includes supplying a gas mixture including at least an oxygen containing gas and a halogen containing gas to etch a first portion of the spacer layer while simultaneously oxidation a second portion of the spacer layer.

In yet another embodiment, a method for pattering a spacer layer disposed on a substrate includes supplying a gas mixture including at least an oxygen containing gas and an halogen containing gas to etch a spacer layer disposed on a substrate, wherein the spacer layer is an amorphous silicon layer or a polysilicon layer, and applying a RF bias power of less than about 250 Watts to etch a first portion of the spacer layer while oxidizing a second portion of the spacer layer.

BRIEF DESCRIPTION OF THE DRAWINGS

So that the manner in which the above recited features of the embodiments herein are attained and can be understood in detail, a more particular description of the disclosure, briefly summarized above, may be had by reference to the examples thereof which are illustrated in the appended drawings.

Figure 1:
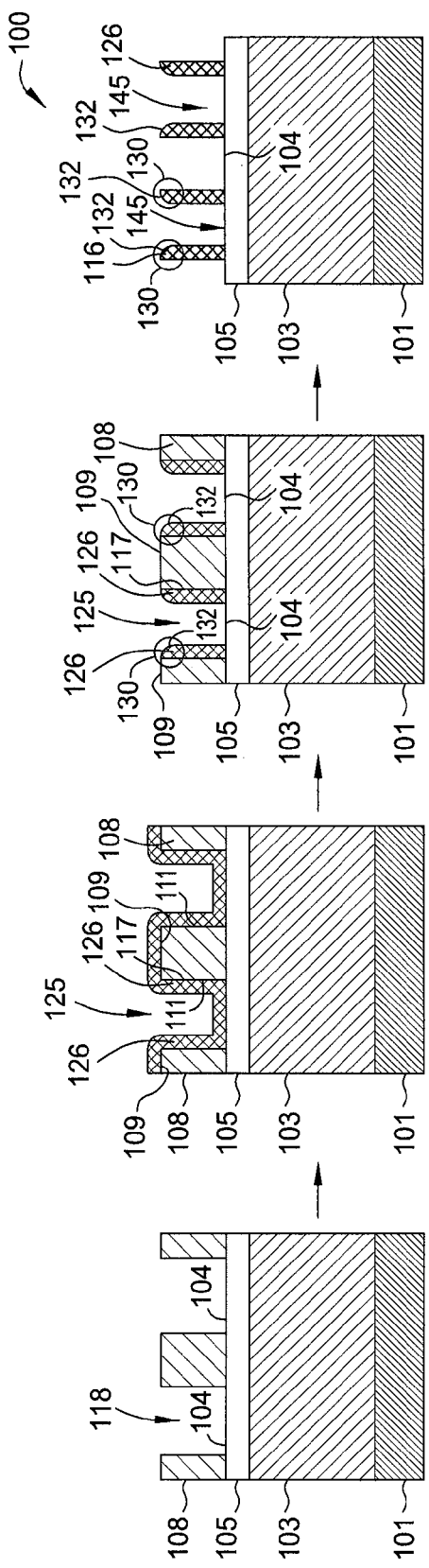
FIGS. 1A-1D depict a conventional cycle for multi-patterning process that utilizes a spacer layer to reduce dimensions of openings.

To facilitate understanding of the embodiments, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary examples and are therefore not to be considered limiting of its scope, for the invention may admit to other equally effective embodiments.

DETAILED DESCRIPTION

Embodiments for the present application includes a process to pattern a spacer layer utilized in a multi-patterning process which may provide a patterned spacer layer with desired accurate dimension and profile without rounded or eroded corners and/or shoulders. The spacer layer may be utilized in a multiple patterning process which may be ultimately used to pattern and etch a dielectric interconnect material for the formation of metal containing features (e.g., nano wires) with high aspect ratios and/or with small dimensions. In one embodiment, the spacer layer patterning process may include a deposition/etching process that may simultaneously etch a first portion of the spacer layer while oxidizing (e.g., forming an oxidation material) a second portion of the spacer layer so as to efficiently control etching profile during the spacer layer patterning process. The deposition/etching process may be performed by applying a gentle low RF bias power less than 250 Watts to a gas mixture including at least an oxygen containing gas and a halogen containing gas so as to efficiently control ion distributions (e.g., ion angles or ion directionality) during the patterning process. As such, a controlled patterning process with desired film profile may be obtained in the spacer layer after the spacer layer patterning process.

Figure 2:
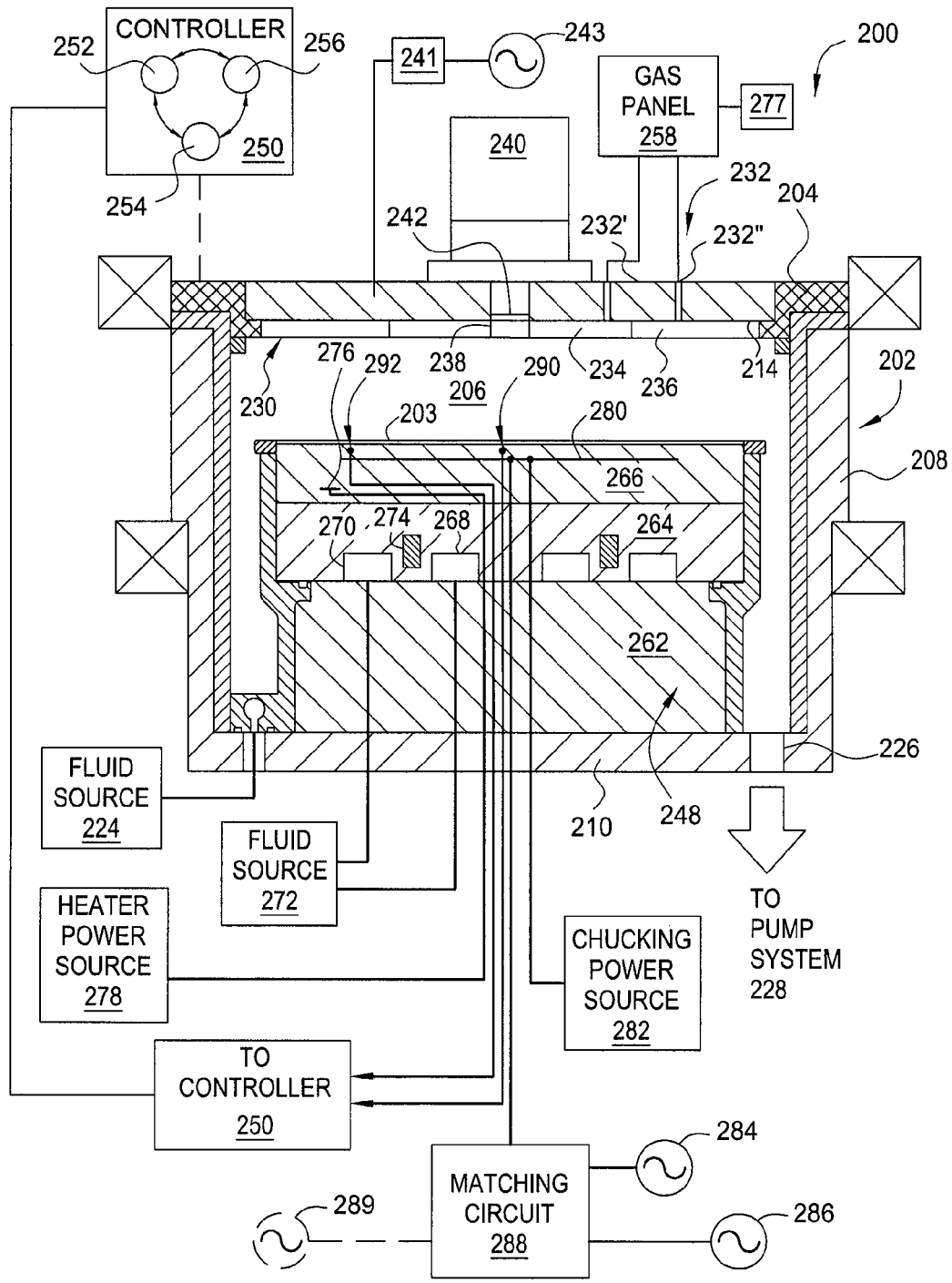
FIG. 2 depicts a processing chamber that may be utilized to form a flowable dielectric layer.

FIG. 2 is a sectional view of one example of a processing chamber 200 suitable for performing a patterning process to etch a planarization layer along with a hardmask layer on a substrate using an etching process. Suitable processing chambers that may be adapted for use with the teachings disclosed herein include, for example, an ENABLER® or C3® processing chamber available from Applied Materials, Inc. of Santa Clara, Calif. Although the processing chamber 200 is shown including a plurality of features that enable superior etching performance, it is contemplated that other processing chambers may be adapted to benefit from one or more of the inventive features disclosed herein.

The processing chamber 200 includes a chamber body 202 and a lid 204 which enclose an interior volume 206. The chamber body 202 is typically fabricated from aluminum, stainless steel or other suitable material. The chamber body 202 generally includes sidewalls 208 and a bottom 210. A substrate support pedestal access port (not shown) is generally defined in a sidewall 208 and a selectively sealed by a slit valve to facilitate entry and egress of a substrate 100 from the processing chamber 200. An exhaust port 226 is defined in the chamber body 202 and couples the interior volume 206 to a pump system 228. The pump system 228 generally includes one or more pumps and throttle valves utilized to evacuate and regulate the pressure of the interior volume 206 of the processing chamber 200. In one implementation, the pump system 228 maintains the pressure inside the interior volume 206 at operating pressures typically between about 10 mTorr to about 500 Torr.

The lid 204 is sealingly supported on the sidewall 208 of the chamber body 202. The lid 204 may be opened to allow excess to the interior volume 106 of the processing chamber 200. The lid 204 includes a window 242 that facilitates optical process monitoring. In one implementation, the window 242 is comprised of quartz or other suitable material that is transmissive to a signal utilized by an optical monitoring system 240 mounted outside the processing chamber 200.

The optical monitoring system 240 is positioned to view at least one of the interior volume 206 of the chamber body 202 and/or the substrate 100 positioned on a substrate support pedestal assembly 248 through the window 242. In one embodiment, the optical monitoring system 240 is coupled to the lid 204 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed. One optical monitoring system that may be adapted to benefit from the invention is the EyeD® full-spectrum, interferometric metrology module, available from Applied Materials, Inc., of Santa Clara, Calif.

A gas panel 258 is coupled to the processing chamber 200 to provide process and/or cleaning gases to the interior volume 206. In the example depicted in FIG. 2, inlet ports 232', 232" are provided in the lid 204 to allow gases to be delivered from the gas panel 258 to the interior volume 206 of the processing chamber 200. In one implementation, the gas panel 258 is adapted to provide fluorinated process gas through the inlet ports 232', 232" and into the interior volume 206 of the processing chamber 200. In one implementation, the process gas provided from the gas panel 258 includes at least a fluorinated gas, chlorine, and a carbon containing gas, an oxygen gas, a nitrogen containing gas and a chlorine containing gas. Examples of fluorinated and carbon containing gases include $CHF_3$, $CH_2F_2$ and $CF_4$. Other fluorinated gases may include one or more of $C_2F$, $C_4F_6$, $C_3F_8$ and $C_5F_8$. Examples of the oxygen containing gas include $O_2$, $CO_2$, $CO$, $N_2O$, $NO_2$, $O_3$, $H_2O$, and the like. Examples of the nitrogen containing gas include $N_2$, $NH_3$, $N_2O$, $NO_2$ and the like. Examples of the chlorine containing gas include $HCl$, $Cl_2$, $CCl_4$, $CHCl_3$, $CH_2Cl_2$, $CH_3Cl$, and the like. Suitable examples of the carbon containing gas include methane ($CH_4$), ethane ($C_2H_6$), ethylene ($C_2H_4$), and the like.

A showerhead assembly 230 is coupled to an interior surface 214 of the lid 204. The showerhead assembly 230 includes a plurality of apertures that allow the gases flowing through the showerhead assembly 230 from the inlet ports 232', 232" into the interior volume 206 of the processing chamber 200 in a predefined distribution across the surface of the substrate 100 being processed in the processing chamber 200.

A remote plasma source 277 may be optionally coupled to the gas panel 258 to facilitate dissociating gas mixture from a remote plasma prior to entering into the interior volume 206 for processing. A RF source power 243 is coupled through a matching network 241 to the showerhead assembly 230. The RF source power 243 typically is capable of producing up to about 3000 W at a tunable frequency in a range from about 50 kHz to about 200 MHz.

The showerhead assembly 230 additionally includes a region transmissive to an optical metrology signal. The optically transmissive region or passage 238 is suitable for allowing the optical monitoring system 240 to view the interior volume 206 and/or the substrate 100 positioned on the substrate support pedestal assembly 248. The passage 238 may be a material, an aperture or plurality of apertures formed or disposed in the showerhead assembly 230 that is substantially transmissive to the wavelengths of energy generated by, and reflected back to, the optical monitoring system 240. In one embodiment, the passage 238 includes a window 242 to prevent gas leakage through the passage 238. The window 242 may be a sapphire plate, quartz plate or other suitable material. The window 242 may alternatively be disposed in the lid 204.

In one implementation, the showerhead assembly 230 is configured with a plurality of zones that allow for separate control of gas flowing into the interior volume 206 of the processing chamber 200. In the example illustrated in FIG. 2, the showerhead assembly 230 as an inner zone 234 and an outer zone 236 that are separately coupled to the gas panel 258 through separate inlet ports 232', 232".

The substrate support pedestal assembly 248 is disposed in the interior volume 206 of the processing chamber 200 below the gas distribution (showerhead) assembly 230. The substrate support pedestal assembly 248 holds the substrate 100 during processing. The substrate support pedestal assembly 248 generally includes a plurality of lift pins (not shown) disposed therethrough that are configured to lift the substrate 100 from the substrate support pedestal assembly 248 and facilitate exchange of the substrate 100 with a robot (not shown) in a conventional manner. An inner liner 218 may closely circumscribe the periphery of the substrate support pedestal assembly 248.

In one implementation, the substrate support pedestal assembly 248 includes a mounting plate 262, a base 264 and an electrostatic chuck 266. The mounting plate 262 is coupled to the bottom 210 of the chamber body 202 includes passages for routing utilities, such as fluids, power lines and sensor leads, among others, to the base 264 and the electrostatic chuck 166. The electrostatic chuck 266 comprises at least one clamping electrode 280 for retaining the substrate 100 below showerhead assembly 230. The electrostatic chuck 266 is driven by a chucking power source 282 to develop an electrostatic force that holds the substrate 100 to the chuck surface, as is conventionally known. Alternatively, the substrate 100 may be retained to the substrate support pedestal assembly 248 by clamping, vacuum or gravity.

At least one of the base 264 or electrostatic chuck 266 may include at least one optional embedded heater 276, at least one optional embedded isolator 274 and a plurality of conduits 268, 270 to control the lateral temperature profile of the substrate support pedestal assembly 248. The conduits 268, 270 are fluidly coupled to a fluid source 272 that circulates a temperature regulating fluid therethrough. The heater 276 is regulated by a power source 278. The conduits 268, 270 and heater 276 are utilized to control the temperature of the base 264, thereby heating and/or cooling the electrostatic chuck 266 and ultimately, the temperature profile of the substrate 100 disposed thereon. The temperature of the electrostatic chuck 266 and the base 264 may be monitored using a plurality of temperature sensors 290, 292. The electrostatic chuck 266 may further comprise a plurality of gas passages (not shown), such as grooves, that are formed in a substrate support pedestal supporting surface of the electrostatic chuck 266 and fluidly coupled to a source of a heat transfer (or backside) gas, such as He. In operation, the backside gas is provided at controlled pressure into the gas passages to enhance the heat transfer between the electrostatic chuck 266 and the substrate 100.

In one implementation, the substrate support pedestal assembly 248 is configured as a cathode and includes an electrode 280 that is coupled to a plurality of RF power bias sources 284, 286. The RF bias power sources 284, 286 are coupled between the electrode 280 disposed in the substrate support pedestal assembly 248 and another electrode, such as the showerhead assembly 230 or ceiling (lid 204) of the chamber body 202. The RF bias power excites and sustains a plasma discharge formed from the gases disposed in the processing region of the chamber body 202.

In the example depicted in FIG. 2, the dual RF bias power sources 284, 286 are coupled to the electrode 280 disposed in the substrate support pedestal assembly 248 through a matching circuit 288. The signal generated by the RF bias power sources 284, 286 is delivered through matching circuit 188 to the substrate support pedestal assembly 248 through a single feed to ionize the gas mixture provided in the plasma processing chamber 200, thereby providing ion energy necessary for performing a deposition or other plasma enhanced process. The RF bias power sources 284, 286 are generally capable of producing an RF signal having a frequency of from about 50 kHz to about 200 MHz and a power between about 0 Watts and about 5000 Watts. An additional bias power source 289 may be coupled to the electrode 280 to control the characteristics of the plasma.

In one mode of operation, the substrate 100 is disposed on the substrate support pedestal assembly 248 in the plasma processing chamber 200. A process gas and/or gas mixture is introduced into the chamber body 202 through the showerhead assembly 230 from the gas panel 258. A vacuum pump system 228 maintains the pressure inside the chamber body 202 while removing deposition by-products.

A controller 250 is coupled to the processing chamber 200 to control operation of the processing chamber 200. The controller 250 includes a central processing unit (CPU) 252, a memory 254, and a support circuit 256 utilized to control the process sequence and regulate the gas flows from the gas panel 258. The CPU 252 may be any form of general purpose computer processor that may be used in an industrial setting. The software routines can be stored in the memory 254, such as random access memory, read only memory, floppy, or hard disk drive, or other form of digital storage. The support circuit 256 is conventionally coupled to the CPU 252 and may include cache, clock circuits, input/output systems, power supplies, and the like. Bi-directional communications between the controller 250 and the various components of the processing chamber 200 are handled through numerous signal cables.

Figure 3:
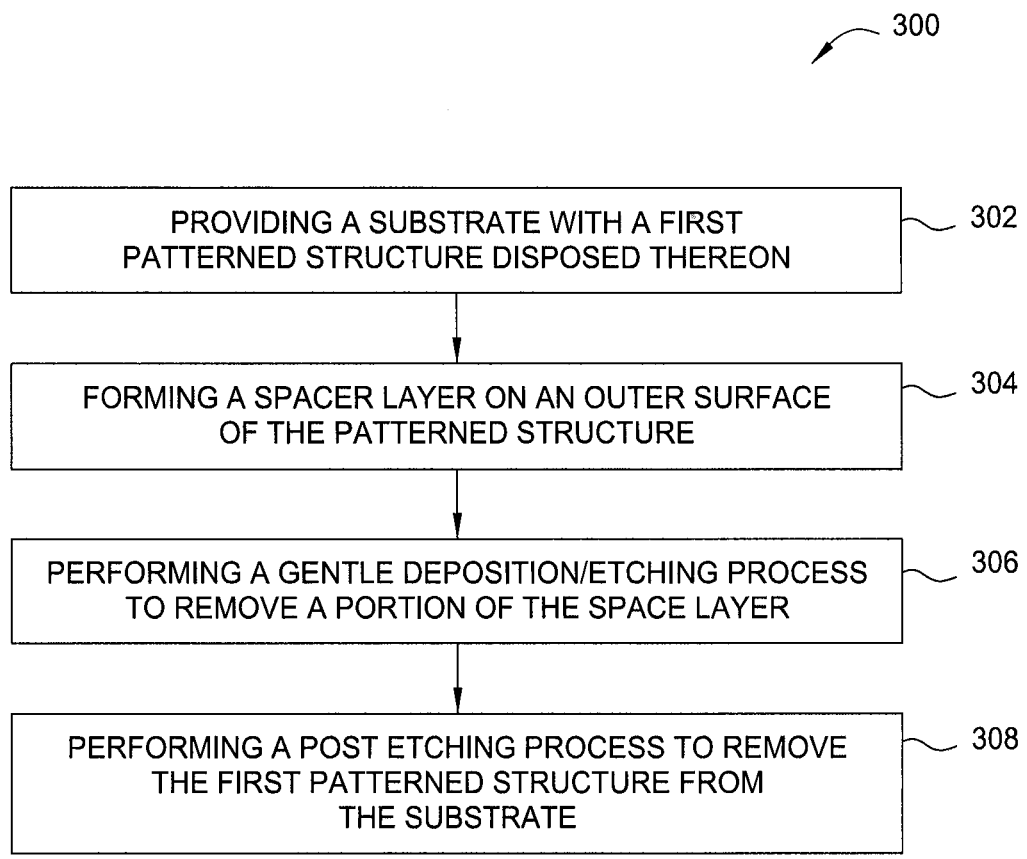
FIG. 3 depicts a flow diagram for performing a spacer layer patterning process.

FIG. 3 illustrates a method 300 for patterning a spacer layer on a substrate, which may be later utilized to form a patterning structure during a multiple pattering process for semiconductor devices. FIGS. 4A-4E are cross-sectional views of a portion of a substrate 402 with corresponding to various stages of the method 300. In one example, a spacer layer may be utilized to reduce dimensions of openings formed in patterned structures on a substrate surface during/ in a multiple patterning process. Alternatively, the method 300 may be beneficially utilized to etch or remove residuals for other types of structures.

Figure 4A:
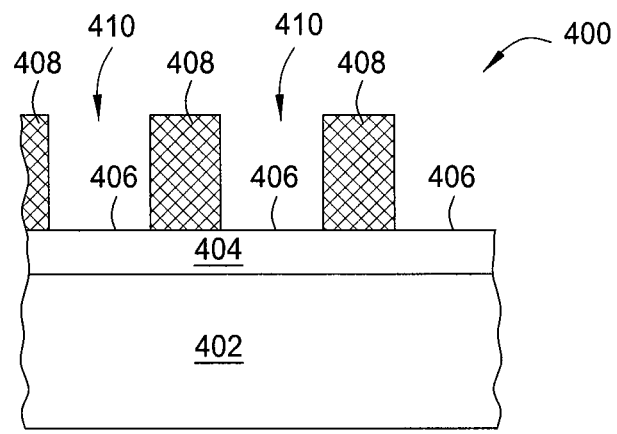
FIGS. 4A-4E depict a film stack at various stages during a multiple patterning process to pattern a spacer layer in a substrate utilizing the process depicted in FIG. 3.

The method 300 begins at operation 302 by providing a substrate, such as the substrate 402 depicted in FIG. 4A, having a film stack 400 formed thereon, as shown in FIG. 4A. The substrate 402 may be a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 402 may have various dimensions, such as 200 mm, 300 mm, 450 mm or other diameter, as well as, being a rectangular or square panel. Unless otherwise noted, examples described herein are conducted on substrates with a 200 mm diameter, a 300 mm diameter, or a 450 mm diameter substrate.

The film stack 400 includes at least a dielectric layer 404 disposed on the substrate 402, which may be later utilized to form another patterned structure to facilitate transferring features into the underlying substrate 402. In the embodiment shown in FIG. 4A, the dielectric layer 404 is formed on the substrate 402. It is noted that the dielectric layer 404 may be formed in direct contact or indirect contact (e.g., with additional layers or structures formed between the dielectric layer 404 and the substrate 402) as needed.

In one embodiment, the dielectric layer 404 is silicon oxide, silicon nitride, silicon oxynitride, high-k material, or combinations thereof and the like. The high-k materials referred herein are dielectric materials having dielectric constants greater than 4.0. Suitable examples of the high-k material layer include hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), and platinum zirconium titanium (PZT), among others. In the embodiment depicted in FIG. 4A, the dielectric layer 404 layer 404 is a silicon oxide layer having a thickness between about 10 nm and about 300 nm.

A patterned structure 408 with a plurality of openings 410 (e.g., a first group of openings) formed therein may be disposed on the dielectric layer 404, exposing a portion 406 of the dielectric layer 404 to facilitate transferring features into the dielectric layer 404 so as to form a desired semiconductor structure 400 on the substrate 402 as desired. The patterned structure 408 may be a single layer or a composite layer as needed. In one embodiment, the patterned structure 408 may be fabricated from a silicon containing material, such as polysilicon, crystalline silicon, amorphous silicon, doped silicon materials, or any suitable silicon containing material. In one particular example, the patterned structure 408 is fabricated from an amorphous silicon layer or a polysilicon layer.

Figure 4B:
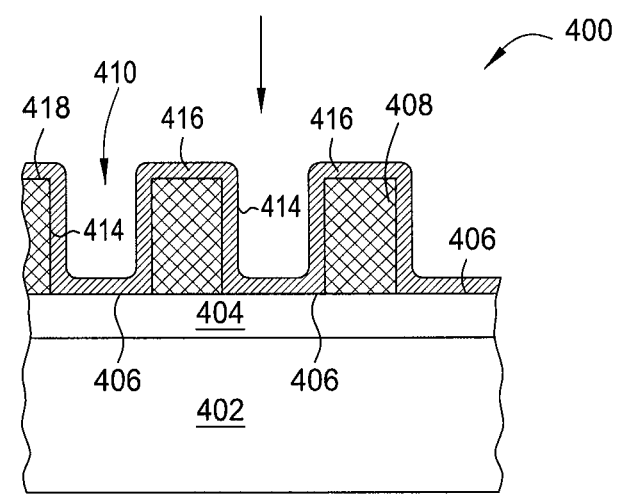

At operation 304, a spacer layer 416 is conformally formed on sidewalls 414 and upper surfaces 418 of the patterned structure 408 as well as the exposed portion 406 of the dielectric layer 404, as shown in FIG. 4B. The spacer layer 416 may be a dielectric material different from the materials selected for the dielectric layer 404. In one example, the spacer layer 416 is a silicon containing layer, such as a polysilicon layer, microcrystalline silicon layer, nanocrystalline layer, amorphous silicon layer and the like. The spacer layer 416 may be formed by a CVD process, an epitaxial deposition process, a furnace process, an ALD process or any suitable deposition techniques in a PVD, CVD, ALD, or other suitable plasma processing chambers. In one particular example, the spacer layer 417 has a thickness between about 7 nm and about 25 nm.

Figure 4C:
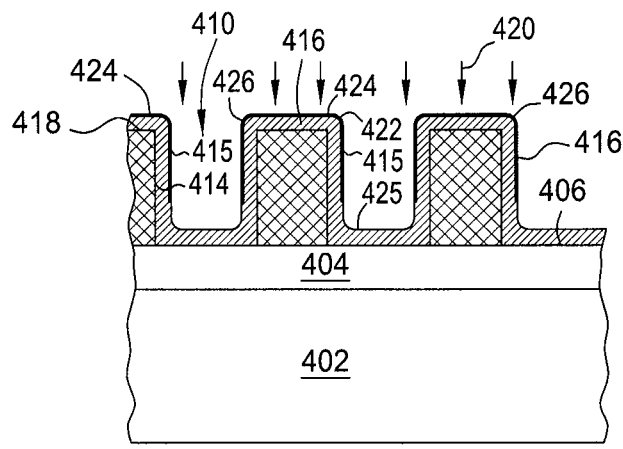

At operation 306, a gentle etching and deposition process is performed to etch a portion of the spacer layer 416 from the substrate 402 while forming an oxidation layer at certain portions of the spacer layer 416 simultaneously. It is believed that with controlled trajectory and directionality of the ions from the plasma generated during the etching/ deposition process, a controlled etching behavior as well as a deposition contribution may be obtained so as to efficiently carve the spacer layer 416 in a manner that would yield a desired resultant film profile. In one embodiment, the etching/deposition process as performed during operation 306 may predominately form an oxidation layer on particularly sidewalls 414 and corners 422 of the spacer layer 416, as shown in FIG. 4C. As a result, the active etching species from the plasma may selectively etch only certain portions, e.g., the top surface 424 or the bottom surface 425, of the spacer layer 416, without significantly attacking, eroding, or damaging other portions, e.g., the corner 422 and sidewall 415, of the spacer layer 416 so as to obtain a good profile of the spacer layer 416 after the etching/deposition process. By doing so, the likelihood of rounded corners, eroded sidewalls, or deformed profile formed on the resultant spacer layer 416 may be efficiently reduced or eliminated.

In one example, the gentle etching and deposition process may be performed by supplying an etching gas mixture including at least oxygen containing gas and a halogen containing gas. Suitable examples of the oxygen containing gas include $O_2$, $CO_2$, CO, $N_2O$, $NO_2$, $O_3$, and $H_2O$. The halogen containing gas that may be supplied in the gas mixture may be a fluorine containing gas, a chlorine containing gas, or a bromide containing gas. Suitable examples of the halogen containing gas include $CHF_3$, $CH_2F_2$, $CF_4$, $C_2F$, $C_4F_6$, $C_3F_8$, HCl, $C_4F_8$, $Cl_2$, $CCl_4$, $CHCl_3$, $CHF_3$, $C_2F_6$, $CH_2Cl_2$, $CH_3Cl$, $SF_6$, $NF_3$, HBr, $Br_2$ and the like. Particularly, examples of the chlorine containing gas include HCl, $Cl_2$, $CCl_4$, $CHCl_3$, $CH_2Cl_2$, $CH_3Cl$, and the like, and examples of the bromide containing gas include HBr, $Br_2$ and the like. While supplying the etching gas mixture into the processing chamber, an inert gas may also be supplied into the etching gas mixture to assist the profile control as needed. Examples of the inert gas supplied in the gas mixture include Ar, He, Ne, Kr, Xe or the like. In one example, the halogen containing gas supplied in the gentle etching gas mixture may be selected from a group consisting of HCl, $Cl_2$, HBr, and $Br_2$. In one particular example, the gases supplied in the etching gas mixture include $O_2$ and $Cl_2$.

Figure 4D:
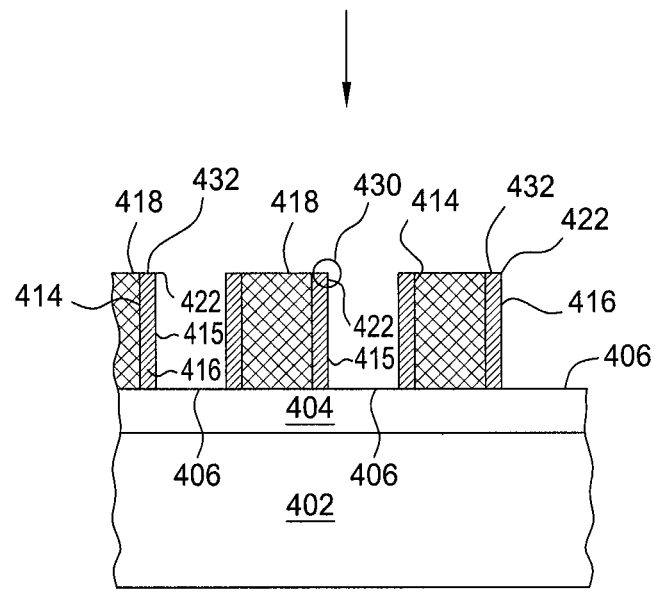

The etching/deposition process may be continuously performed until the upper surface 418 of the patterned structure 408 is exposed, as shown in FIG. 4D. By utilizing the simultaneous etching/deposition process, the spacer layer 416 may be etched and shaped in a controlled manner that can provide the desired profile with the desired substantially sharp right angle (e.g., perpendicular) corners 422, as indicated at circle 430 in FIG. 4D, with upright (e.g., straight, vertical) sidewall 415 with steep slope and accurate dimension.

During the etching process at operation 306, the etching/deposition process may be performed at an etching reactor, such as the plasma processing chamber 200 depicted in FIG. 2. While performing the etching/deposition process in the processing chamber 200, the chamber pressure of the etching gas mixture is also regulated. In one exemplary embodiment, a process pressure in the plasma processing chamber is regulated between about 2 mTorr to about 100 mTorr, for example, at about 7 mTorr. RF source power may be applied to maintain a plasma formed from the etching gas mixture. For example, a RF source power with a frequency of about 13.56 MHz may be applied at an energy level of between about 200 Watts to about 500 Watts, such as about 350 Watts, to an inductively coupled antenna source to maintain a plasma inside the etch chamber.

In addition, a low RF bias power, with a frequency of between about 2 MHz and about 13.56 MHz, may be applied less than 250 Watts, such as between about 40 Watts to about 200 Watts. It is believed that the low RF bias power supplied in the gas mixture may provide more ion energy with vertical and straight ion profiles. In contrast, it is believed that high RF bias power have a progressively much more concentrated ion/plasma density. Thus, by selecting RF bias power at a relative low regime, ion directions (e.g., ion angles) may be efficiently controlled, thereby promoting localized etching/deposition efficiency. The trajectory and directionality of the ions accelerated by the selected low RF power may promote oxidation at a target location, especially the corners 422 and sidewalls 415 of the spacer layer 416, while etching other locations, especially top and bottom surfaces 424, 425 of the spacer layer 416, so as to provide the resultant spacer layer 416 with desired vertical, straight and sharp corner profiles.

In one example, the oxygen containing gas may be flowed into the chamber at a rate between about 1 sccm to about 20 sccm. The halogen-containing gas, such as a chlorine containing gas or bromide containing gas, may be supplied at a flow rate between about 40 sccm and about 120 sccm. The inert gas, if present, may be supplied at a flow rate between about 150 sccm and about 300 sccm. Alternatively, the oxygen containing gas and the halogen containing gas may be supplied at a flow ratio (i.e., $O_2:Cl_2$) by volume between about 1:40 and about 1:2, such as between about 1:20 and about 1:4. A substrate temperature is maintained between about 30 degrees Celsius to about 500 degrees Celsius. In another embodiment, the substrate temperature is maintained about greater than 80 degrees Celsius, such as greater than about 120 degrees Celsius, for example, about 150 degrees Celsius.

Figure 4E:
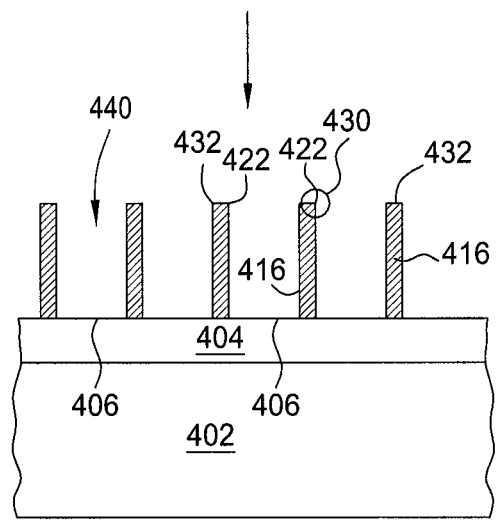

At operation 308, after the spacer layer 416 with the desired profile is formed on the substrate 402, a post etching process may then be performed to remove the patterned structure 408 from the substrate 402, as shown in FIG. 4E, leaving the patterned spacer layer 416 with reduced dimension openings 440 (e.g., a second group of openings) defined therebetween as an etching mask for the following manufacturing process.

The post etching process may be performed by supplying a post etching gas mixture into the processing chamber, such as the processing chamber 200 depicted in FIG. 2. It is noted that the gentle etching/deposition process at operation 306 may be performed at the same processing chamber (e.g., in-situ) where the post etching process at operation 308 is performed. The post etching gas mixture may be performed to selectively and predominately etching the patterned structure 408 without etching or damaging the spacer layer 416. Furthermore, reactive gases selected in the post etching gas mixture may be different based on the materials selected to fabricate the patterned structure 408. For example, in the embodiment wherein the patterned structure 408 is fabricated from an amorphous carbon layer, the post etching gas mixture supplied to etching the patterned structure 408 may include at least one oxygen containing gas. Additionally, a nitrogen containing gas and/or a hydrogen containing gas may also be supplied in the post etching gas mixture. In one particular example, the post etching gas mixture includes $O_2$, $N_2$ and $H_2$.

An inert gas may be optionally supplied with the post etching gas mixture to assist carrying the gas mixture into the etch chamber. Suitable examples of the inert gases include $N_2$, Ar, He, Xe and Kr gas.

Several process parameters are regulated while the etching gas mixture is supplied into the etch chamber applying the RF power. In one embodiment, the chamber pressure is regulated between about 5 mTorr to about 400 mTorr, for example, at about 40 mTorr. The RF source power of about 200 Watts to about 3000 Watts may be applied to an capacitively coupled antenna source to maintain a plasma inside the etch chamber. The RF bias power of about 200 Watts to about 10000 Watts may be applied to the processing chamber. The fluorine based gas may be flowed into the chamber at a rate between about 30 sccm to about 300 sccm. A substrate temperature is maintained between about −10 degrees Celsius to about 60 degrees Celsius.

Thus, embodiments of pattering a spacer layer for performing a multi-patterning process are provided to produce a patterned spacer layer with desired edge/corner profile. By utilizing a low RF bias power during an etching/deposition process in the spacer layer patterning process, a controlled ion trajectory/directionality may be obtained so as to pattern the spacer layer in s desired manner that yields a patterned spacer layer with desired accurate and right angle corners and vertical sidewall profile.

While the foregoing is directed to embodiments of the present invention, other and further embodiments of the invention may be devised without departing from the basic scope thereof, and the scope thereof is determined by the claims that follow:

What is claimed is:

1. A method for patterning a spacer layer during a multiple patterning process, comprising:
    conformally forming a spacer layer on an outer surface of a patterned structure disposed on a substrate, wherein the patterned structure has having a first group of openings defined therebetween, wherein the spacer layer is a polysilicon silicon or an amorphous silicon;
    etching the spacer layer disposed on the substrate while forming an oxidation layer on the spacer layer by simultaneously supplying an oxygen containing gas and a halogen containing gas; and
    simultaneously forming an oxidation layer at corners and sidewalls of the spacer layer to provide the corners of the spacer layer with a substantially sharp right angle.

2. The method of claim 1, wherein the patterned structure includes an amorphous carbon material.

3. The method of claim 1, wherein the oxygen containing gas is $O_2$.

4. The method of claim 1, wherein the halogen containing gas is selected from a group consisting of HCl, $Cl_2$, HBr, and $Br_2$.

5. The method of claim 1, wherein supplying the oxygen containing gas and the halogen containing gas further comprises:
applying a RF bias power of less than 250 Watts.

6. The method of claim 1, wherein etching the spacer layer further comprises:
predominately etching a top surface and a bottom surface of the spacer layer while forming an oxidation layer at corners and sidewalls of the spacer layer.

7. The method of claim 1, further comprising:
continuing etching a first portion of the spacer layer while oxidizing a second portion of the spacer layer until a top surface of the patterned structure is exposed.

8. The method of claim 7, further comprising:
removing the patterned structure from the substrate.

9. The method of claim 8, further comprising:
using the etched spacer layer as an etching mask.

10. The method of claim 8, further comprising:
forming a second group of openings in the etched spacer layer with a dimension less than that of the first group of openings.

11. The method of claim 1, wherein supplying the oxygen containing and the halogen containing gas further comprises:
supplying the oxygen containing gas and the halogen containing gas at a flow ratio by volume between about 1:40 and about 1:5.

12. The method of claim 1, further comprising a dielectric layer disposed between the patterned structure and the substrate.

13. The method of claim 12, wherein the dielectric layer is a silicon oxide layer.

14. A method for patterning a spacer layer during a multiple patterning process, comprising:
performing a patterning process on a spacer layer disposed on a substrate, wherein the spacer layer is conformally formed on an outer surface of a patterned structure formed on a film stack disposed on a substrate, wherein the spacer layer is a polysilicon silicon or an amorphous silicon, wherein the patterning process further comprises:
supplying a gas mixture including at least an oxygen containing gas and a halogen containing gas simultaneously to etch a first portion of the spacer layer while simultaneously oxidation a second portion of the spacer layer to provide corners of the spacer layer with a substantially sharp right angle.

15. The method of claim 14, where supplying the gas mixture further comprising:
applying an RF bias power of less than 250 Watts in the gas mixture.

16. The method of claim 14, further comprising:
performing a post etching process to selectively remove the patterned structure from the substrate without damaging the spacer layer remaining on the substrate; and
using the remaining spacer layer as an etching mask.

17. The method of claim 14, wherein the first portion is a top and bottom surface of the spacer layer and the second portion is a corner or sidewall of the spacer layer.

18. A method for patterning a spacer layer disposed on a substrate, comprising:
supplying a gas mixture including at least an oxygen containing gas and a halogen containing gas simultaneously to etch a spacer layer disposed on a substrate, wherein the spacer layer is an amorphous silicon layer or a polysilicon layer;
applying an RF bias power of less than about 250 Watt; and
predominately etching a top surface and a bottom surface of the spacer layer while forming an oxidation layer at corners and sidewalls of the spacer layer to provide the corners of the spacer layer with a substantially sharp right angle.

* * * * *